(12) United States Patent
Kinoshita et al.

(10) Patent No.: US 8,319,266 B1
(45) Date of Patent: Nov. 27, 2012

(54) ETCH STOP LAYER FOR MEMORY CELL RELIABILITY IMPROVEMENT

(75) Inventors: Hiroyuki Kinoshita, San Jose, CA (US);
Angela Hui, Fremont, CA (US);
Hsiao-Han Thio, Santa Clara, CA (US);
Kuo-Tung Chang, Saratoga, CA (US);
Minh Van Ngo, Fremont, CA (US);
Hiroyuki Ogawa, Sunnyvale, CA (US)

(73) Assignees: Advanced Micro Devices, Inc., Sunnyvale, CA (US); Spansion L.L.C., Sunnyvale, CA (US)

( * ) Notice: Subject to any disclaimer, the term of this patent is extended or adjusted under 35 U.S.C. 154(b) by 1088 days.

(21) Appl. No.: 11/008,240

(22) Filed: Dec. 10, 2004

(51) Int. Cl.
*H01L 29/788* (2006.01)
(52) U.S. Cl. ........ 257/315; 257/314; 257/316; 257/333; 438/275
(58) Field of Classification Search .......... 257/314–316, 257/318–320, 333, E29.125, E29.131, E29.134; 438/275, 595
See application file for complete search history.

(56) References Cited

U.S. PATENT DOCUMENTS

| 6,518,130 | B1 * | 2/2003 | Ohno | 438/275 |
| 6,613,657 | B1 * | 9/2003 | Ngo et al. | 438/588 |
| 6,703,669 | B1 * | 3/2004 | Goda et al. | 257/390 |
| 6,740,605 | B1 | 5/2004 | Shiraiwa et al. | 438/795 |
| 2004/0094793 | A1 * | 5/2004 | Noguchi et al. | 257/315 |

OTHER PUBLICATIONS

Co-pending U.S. Appl. No. 11/109,719, filed Apr. 20, 2005; entitled: "Void Free Interlayer Dielectric", by Minh Van Ngo et al., 32 pages.

* cited by examiner

*Primary Examiner* — Theresa T Doan
(74) *Attorney, Agent, or Firm* — Harrity & Harrity, LLP

(57) ABSTRACT

A memory device and a method of making the memory device are provided. A first dielectric layer is formed on a substrate, a floating gate is formed on the first dielectric layer, a second dielectric layer is formed on the floating gate, a control gate is formed on the second dielectric layer, and at least one film, including a conformal film, is formed over a surface of the memory device.

14 Claims, 7 Drawing Sheets

ETCH STOP LAYER FOR MEMORY CELL RELIABILITY IMPROVEMENT

TECHNICAL FIELD

The present invention relates generally to semiconductor memory devices and, more particularly, to a semiconductor memory device having an improved reliability.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features often creates problems in memory devices, such as memory cell data retention problems.

DISCLOSURE OF THE INVENTION

Implementations consistent with the invention provide a memory cell with improved memory cell data retention by forming one or more films over the memory cell.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a method of forming a memory device is provided. The method may include forming a first dielectric layer on a substrate, forming a floating gate on the first dielectric layer, forming a second dielectric layer on the floating gate, forming a control gate on the second dielectric layer, and forming at least one film over a surface of the memory device, where a first one of the at least one film is a conformal film.

According to another aspect consistent with the invention, a memory device is provided. The memory device may include a substrate, a first dielectric layer formed on a portion of the substrate, a floating gate formed on the first dielectric layer, a second dielectric layer formed on the floating gate, a control gate formed on the second dielectric layer, a first spacer and a second spacer formed on the substrate on opposite sides of the memory device, and at least one film, which may include a conformal film, formed over a surface of the control gate, the first spacer, the second spacer, and the substrate.

According to a third aspect consistent with the invention, a memory device is provided. The memory device may include a substrate, a first dielectric layer formed on a portion of the substrate, a floating gate formed on the first dielectric layer, a second dielectric layer formed on the floating gate, a control gate formed on the second dielectric layer, and at least two films formed over a surface of the memory device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
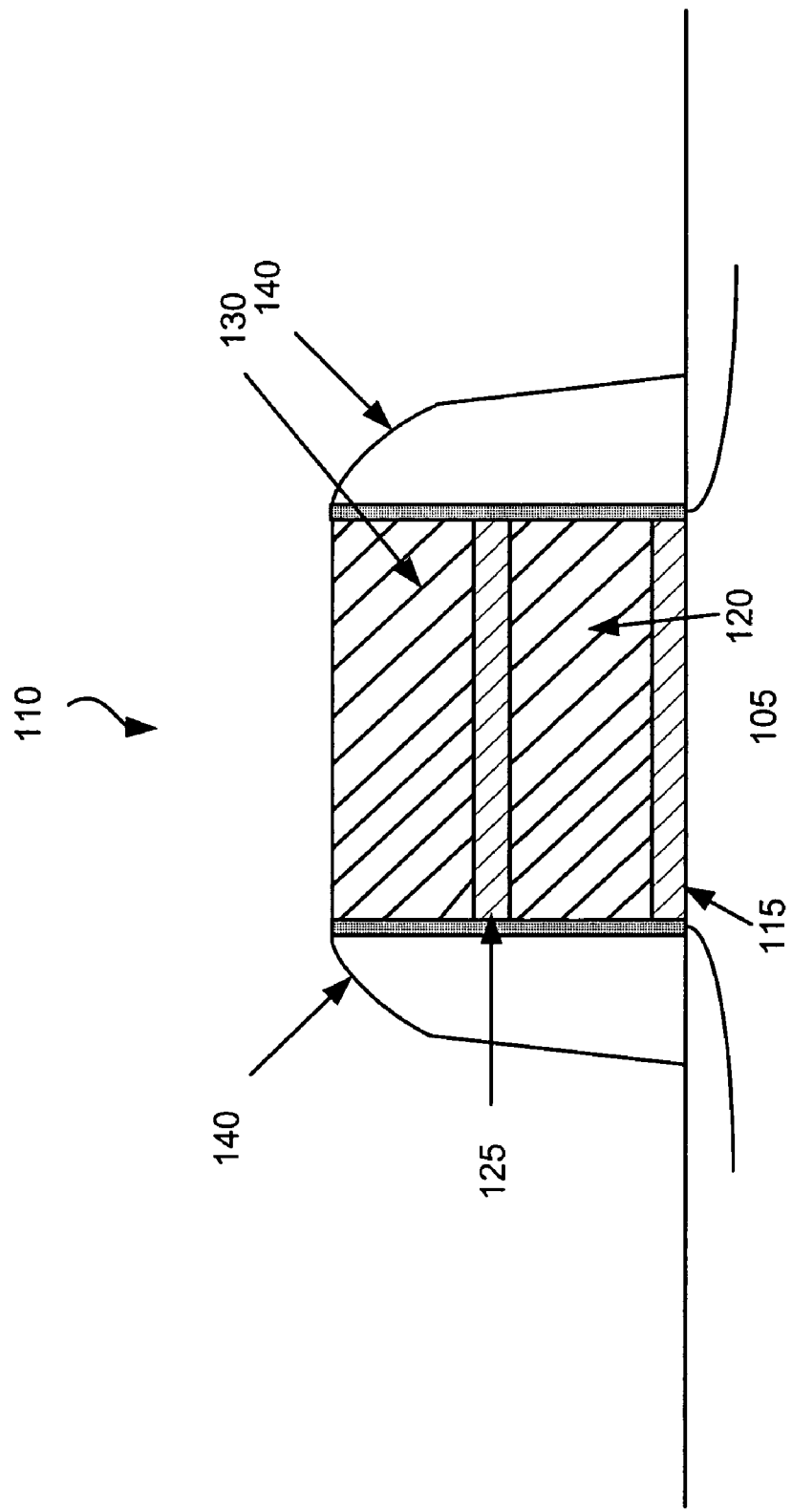
FIG. 1 illustrates an exemplary memory device upon which an etch stop layer may be formed consistent with an aspect of the invention.

FIG. 1 illustrates an exemplary memory device 110 consistent with principles of the invention. Memory device 110 may include a substrate 105, a first dielectric layer 115, a floating gate 120, a second dielectric layer 125, a control gate 130, and spacers 140.

First dielectric layer 115 may be formed on a portion of substrate 105. First dielectric layer 115 may be, for example, a gate oxide layer, which may have a thickness ranging from about 70 Å to about 110 Å. Dielectric layer 115 and may include dielectric materials such as silicon oxide or other types of dielectric materials and may be referred to as a tunnel oxide layer. Floating gate 120 may range in thickness from about 400 Å to about 1,200 Å and may include polysilicon, germanium or other types of materials that may be used to store a charge. Second dielectric layer 125 may have a thickness ranging from about 100 Å to about 200 Å and may include dielectric materials such as silicon oxide, an ONO stack, or other types of dielectric materials. Dielectric layer 115 may function as an inter-gate dielectric for memory device 110.

Control gate 130 may range in thickness from about 900 Å to about 3,000 Å and may include polysilicon, germanium, or other types of semiconducting materials. Spacers 140 may be formed on each side of memory device 110 and may include, for example, a dielectric material. Spacers 140 may function to isolate memory device 110 from other memory devices and may also function to facilitate the formation of source and drain regions.

Figure 2:
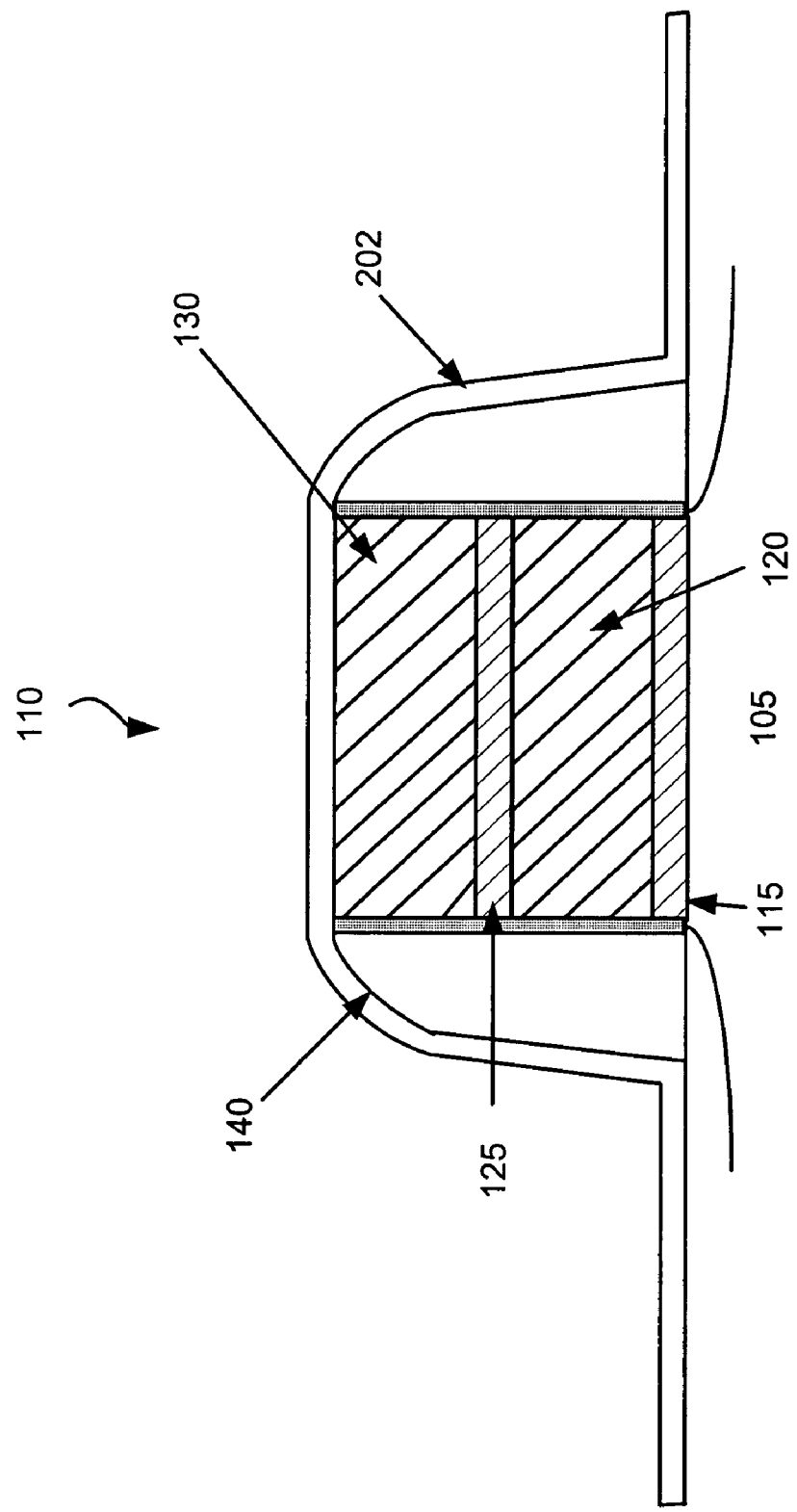
FIG. 2 illustrates the exemplary memory device of FIG. 1 having a film formed thereover consistent with one implementation of the invention.

As shown in FIG. 2, a conformal film 202 (e.g., a film having a substantially uniform thickness on all surfaces, including sidewall surfaces) may be formed over a surface of memory device 110. Conformal film 202 may include, for example, silicon nitride. In some implementations, conformal film 202 may have a thickness of less than 1,000 Å, such as a thickness ranging from about 100 Å to about 700 Å. Conformal film 202 may easily fill gaps and crevices along the stacked gate structure, including first dielectric layer 105, floating gate 120, second dielectric layer 125, and control gate 130, and may have a substantially uniform thickness. Thus, conformal film 202 may fill small gaps and crevices along the stacked gate structure and spacer 140 interfaces, thereby improving memory cell data retention. Conformal film 202 may also provide a relatively thick sidewall deposition along a high aspect ratio gate structure and may protect memory device 110 during subsequent processing. Conformal film 202 may be deposited using a low pressure chemical vapor deposition (LPCVD) process or by using an atomic layer deposition (ALD) process, both of which are well known in the art. Conformal film 202 may also be formed using other conventional techniques.

Figure 3:
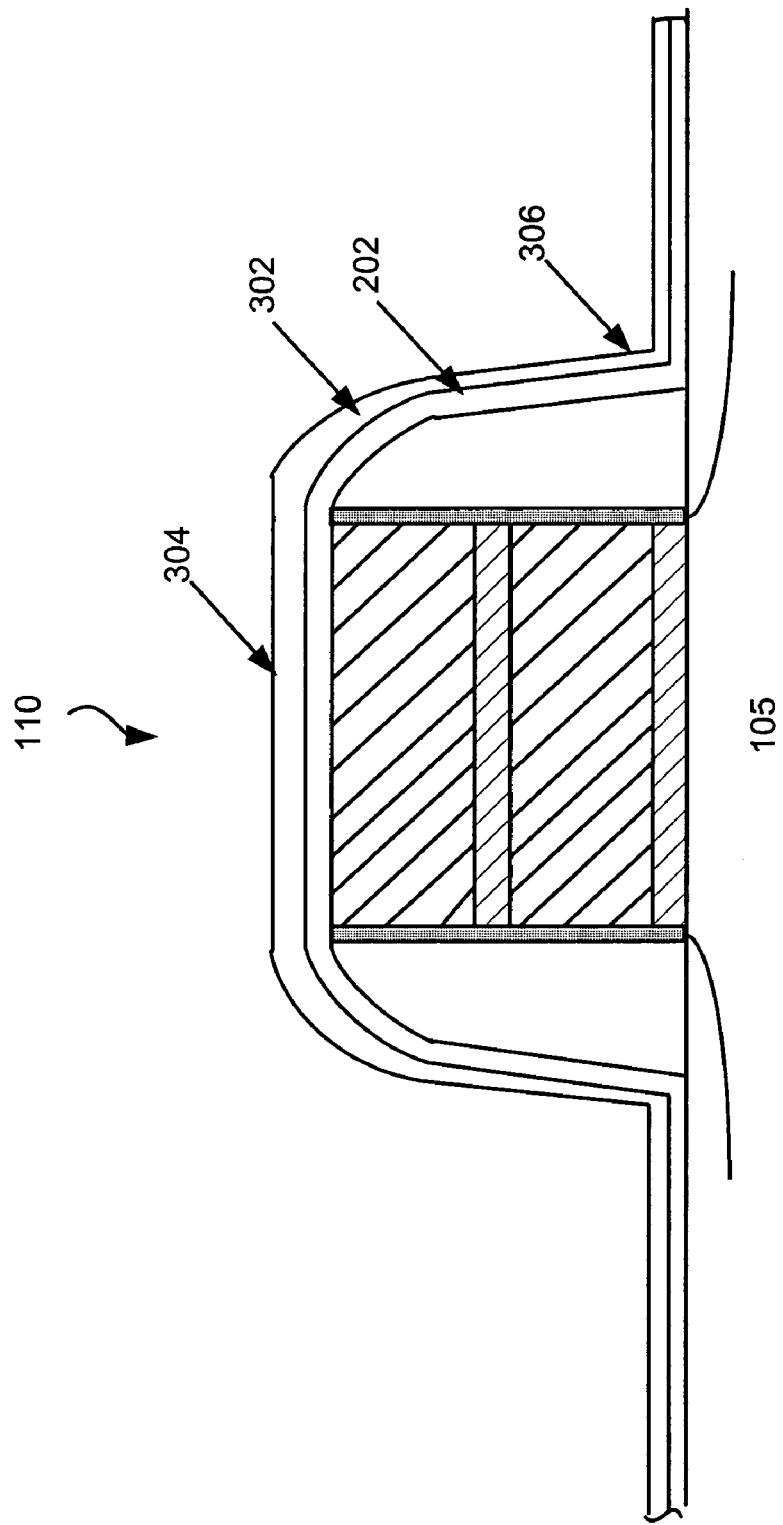
FIG. 3 illustrates the exemplary memory device of FIG. 1 having multiple films formed over the memory device consistent with one implementation of the invention.

FIG. 3 illustrates a second film 302 that may be formed over conformal film 202. Film 302 may include, for example, silicon nitride, which may be deposited over film 202 using a plasma enhanced chemical vapor deposition process (PECVD), which is well known in the art. Film 302 may be a non-conformal film that may tend to form a thicker film at a top portion 304 of memory device 110 and may form a thinner film along a side portion 306 of memory device 110.

When conformal film 202 is deposited using the LPCVD process, it may be deposited at a temperature of about 650° C. to about 750° C. When conformal film 202 is deposited using the ALD process, it may be deposited at a temperature of about 300° C. to about 500° C. When film 302 is deposited using the PECVD process, it may be deposited at a temperature ranging from about 400° C. to about 525° C. Films 202 and 302 may be formed to a combined thickness sufficient to act as a good etch stop layer. In some implementations, the total combined thickness of films 202 and 302 may range from about 100 Å to about 1,000 Å.

Figure 4:
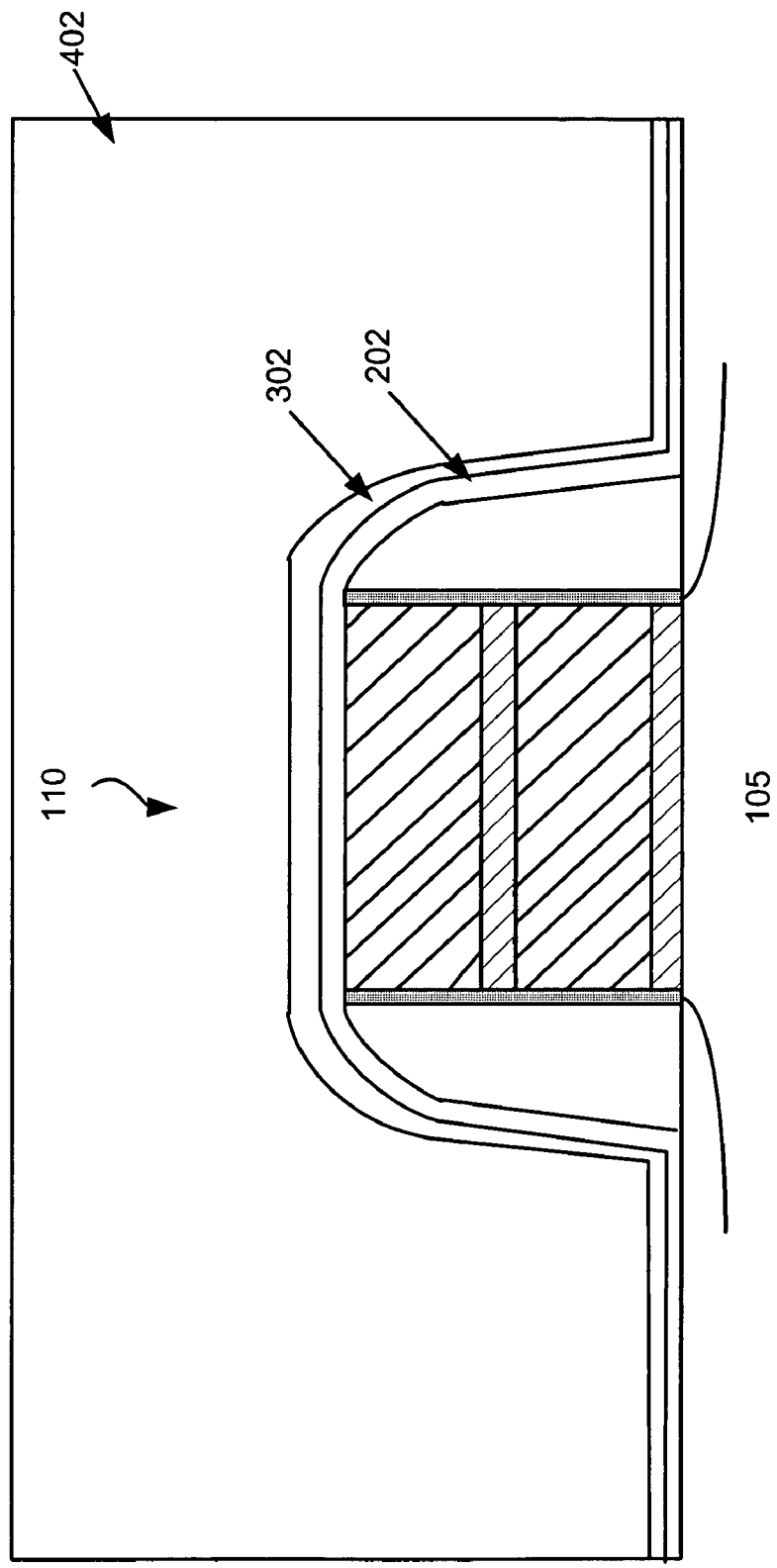
FIG. 4 illustrates the formation of an interlayer dielectric (ILD) over the exemplary memory device of FIG. 3 consistent with the invention.

FIG. 4 illustrates an interlayer dielectric (ILD) 402 formed over memory device 110, including films 202 and 302. ILD 402 may be used to facilitate the formation of a contact formed between layers of conductors that connects different components of a single one of memory devices 110, or interconnects different ones of memory devices 110. ILD 402 may be formed over devices 110 using, for example, existing deposition processes. ILD 402 may include, for example, tetraethylorthosilicate (TEOS), or any other dielectric material. In one exemplary implementation, ILD 402 may include a boro-phosphorous TEOS (BPTEOS). The thickness of ILD 402 may vary based on the sizes of memory device 110, or based on other design or fabrication parameters. In one exemplary embodiment, the thickness of ILD 402 may range from about 5,000 Å to about 15,000 Å. ILD 402 may be polished back to a planar surface using, for example, an existing chemical-mechanical polishing (CMP) process.

Figure 5:
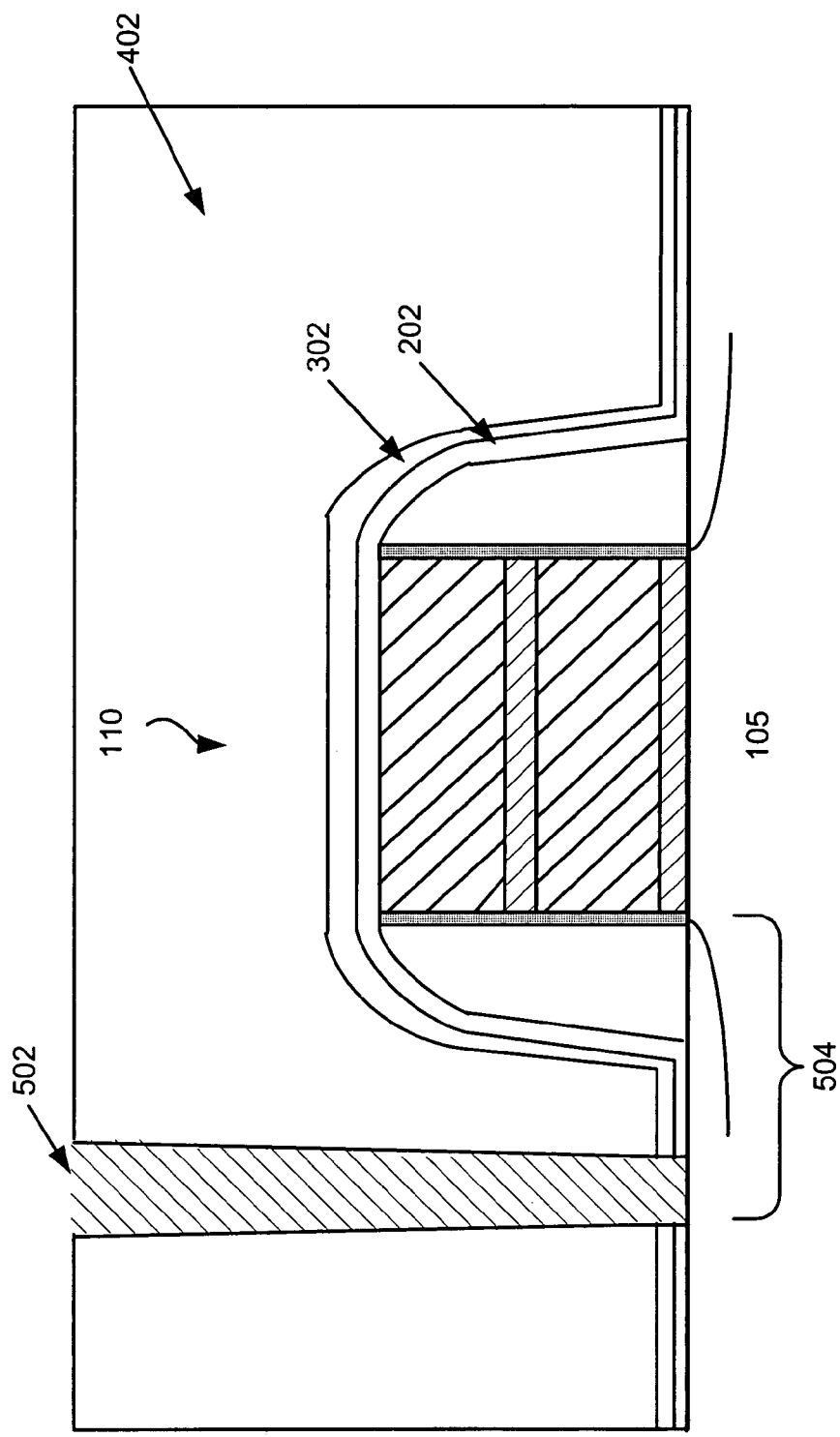
FIG. 5 illustrates the exemplary memory device of FIG. 4 having an etched contact hole formed over a source or drain region of the memory device.

FIG. 5 illustrates a contact hole 502 etched through ILD 402. As illustrated, contact hole 502 may be formed through ILD 402 and films 202 and 302, located on the surface of substrate 105, down to substrate 105. Contact hole 502 may be etched over a region 504 of memory device 110, which may be, for example, a source region or a drain region. Films 202 and 302, as described above, may act to fill small gaps along the stacked gate structure and spacer 140 interfaces to help improve memory cell data retention. Films 202 and 302 also act as etch stop layers when forming contact hole 502. For example, as the etching proceeds through ILD 402, the start of etching of films 302 and 202 may be detected. The etching may then be stopped without etching through substrate 105 (e.g., a source region or drain region). As illustrated in FIG. 5, contact hole 502 may be formed through ILD 402 and films 302 and 202, terminating at the surface of substrate 105.

Figure 6:
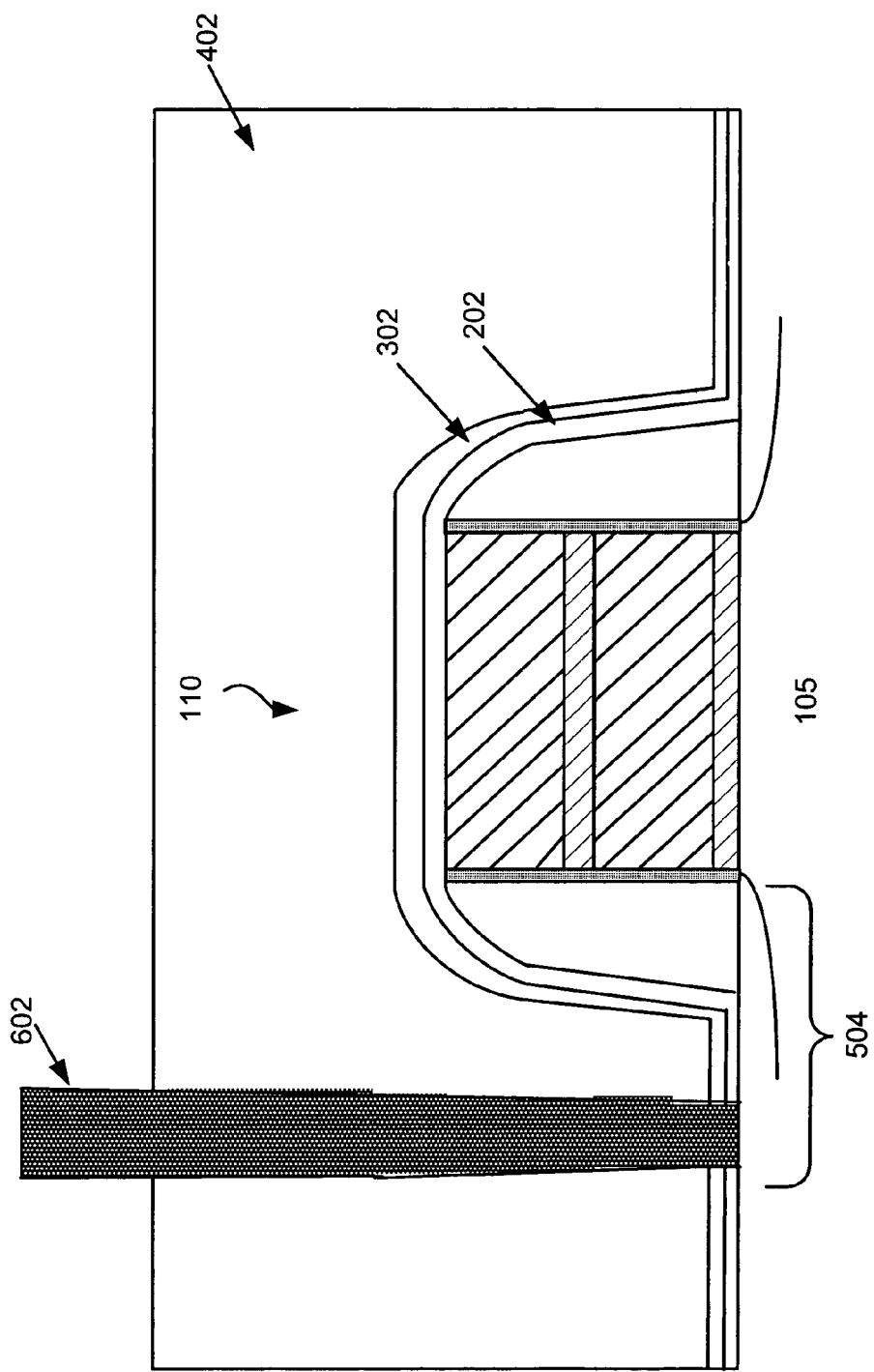
FIG. 6 illustrates the exemplary memory device of FIG. 5 having a contact formed within the etched contact hole.

Contact hole 502 may then be filled with a metal, such as tungsten or polysilicon, to form a contact 602, as illustrated in FIG. 6. Contact 602 may be used for interconnecting a group of memory devices 110, for connecting memory device 110 to an external terminal, for connecting a source or drain region to another conductive structure in memory device 110, or for another purpose.

Figure 7:
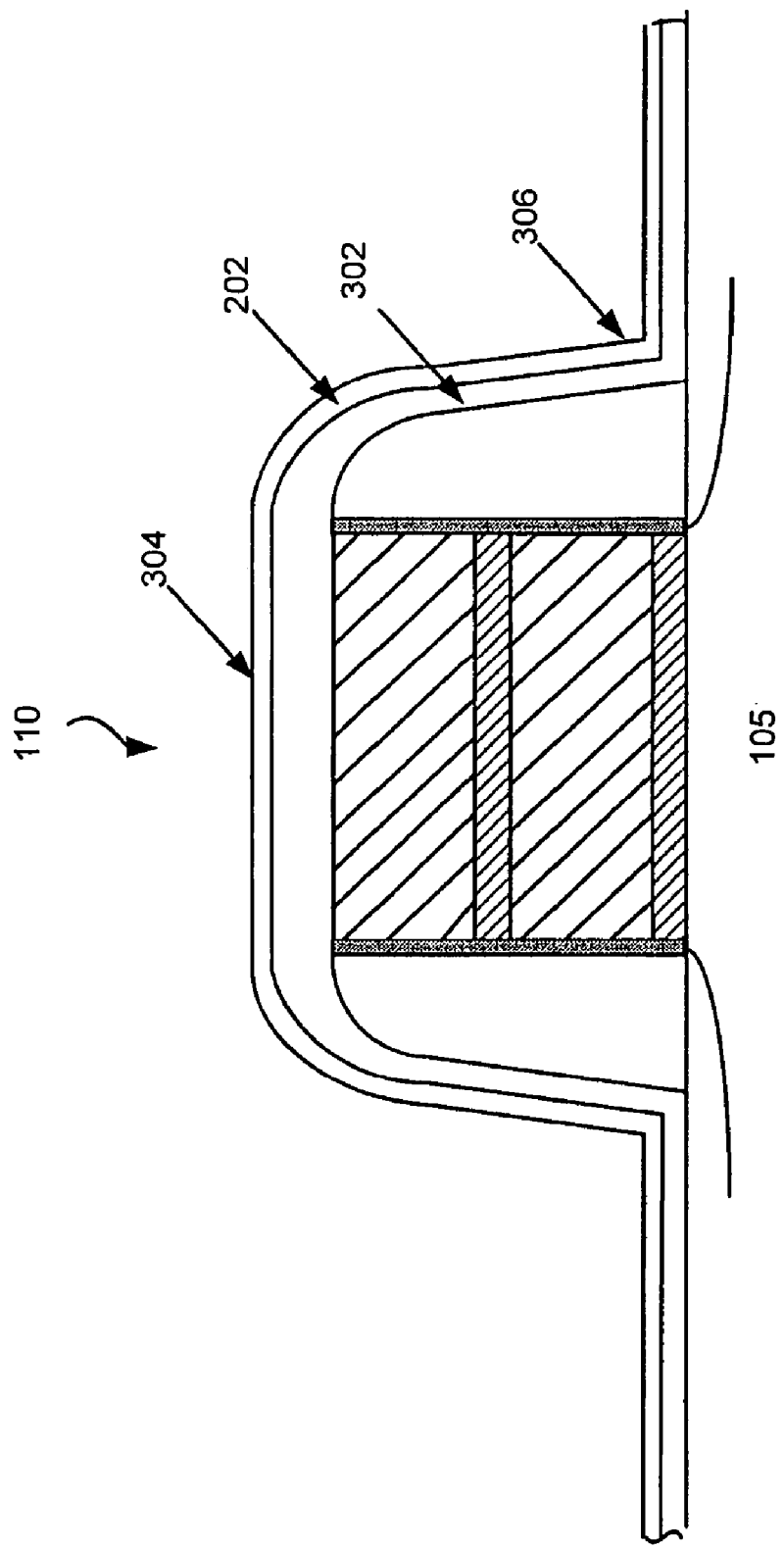
FIG. 7 illustrates films formed over the exemplary memory device of FIG. 1 in accordance with another implementation.

In an alternative implementation, instead of first depositing conformal film 202 and then depositing film 302, as shown in FIGS. 2 and 3, film 302 may be deposited first and then film 202 may be deposited over film 302, as illustrated in FIG. 7. That is, the non-conformal film 302 may be deposited over memory device 110 followed by deposition of the conformal film 202. Further, more than two films may be deposited. For example, film 202 may be deposited, as shown in FIG. 2, film 302 may be deposited next, as shown in FIG. 3, and a second conformal film may be deposited over film 302.

In another alternative implementation, only one film maybe deposited, such as, for example, conformal film 202, as shown in FIG. 2. In this implementation, conformal film 202 may have a thickness ranging from about 100 Å to about 1,000 Å.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts has been described above, the order of the acts may vary in other implementations consistent with the present invention.

The preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:
1. A memory device comprising:
a substrate;
a first dielectric layer formed on a portion of the substrate;
a floating gate formed on the first dielectric layer;
a second dielectric layer formed on the floating gate;
a control gate formed on the second dielectric layer;

a first spacer and a second spacer formed on the substrate on opposite sides of the first dielectric layer, the floating gate, the second dielectric layer, and the control gate;
a first film directly contacting:
   a top surface of the control gate,
   the first spacer,
   the second spacer, and
   the substrate,
   the first film comprising a conformal silicon nitride film having a substantially uniform thickness,
   the conformal silicon nitride film filling gaps and crevices along the first dielectric layer, the floating gate, the second dielectric layer, the control gate, and interfaces associated with the first spacer and the second spacer,
   the conformal silicon nitride film filling the gaps and the crevices to improve memory cell data retention of the memory device,
   the conformal silicon nitride film being deposited using a low pressure chemical vapor deposition (LPCVD) process or using an atomic layer deposition (ALD) process; and
a second film formed directly on the first film,
   the second film comprising a non-conformal silicon nitride film having a non-uniform thickness,
   a portion of the non-conformal silicon nitride film formed over the top surface of the control gate being thicker than another portion of the non-conformal silicon nitride film formed adjacent the first spacer and the second spacer, and
   the non-conformal silicon nitride film being deposited over the conformal silicon nitride film using a plasma enhanced chemical vapor deposition (PECVD) process.

2. The memory device of claim 1, further comprising a third film formed on the second film, where the third film comprises a conformal silicon nitride film having a substantially uniform thickness.

3. The memory device of claim 1, where the conformal silicon nitride film has a thickness of less than 1,000 angstroms.

4. The memory device of claim 1, where the second film has a thickness ranging from about 100 angstroms to about 700 angstroms.

5. The memory device of claim 1, where a combined thickness of the first film and the second film ranges from about 100 angstroms to about 1,000 angstroms.

6. A memory device comprising:
a substrate;
a first dielectric layer formed on a portion of the substrate;
a floating gate formed on the first dielectric layer;
a second dielectric layer formed on the floating gate;
a control gate formed on the second dielectric layer;
a conformal first silicon nitride film having a substantially uniform thickness,
   the conformal first silicon nitride film directly contacting a portion of the substrate,
   the conformal first silicon nitride film filling gaps and crevices along the first dielectric layer, the floating gate, the second dielectric layer, the control gate, and interfaces associated with a first spacer and a second spacer, the first spacer and the second spacer being formed on the substrate and on opposite sides of the control gate,
   the conformal first silicon nitride film filling the gaps and the crevices to improve memory cell data retention of the memory device,
   the conformal first silicon nitride film being deposited using a low pressure chemical vapor deposition (LPCVD) process or using an atomic layer deposition (ALD) process; and
a non-conformal second silicon nitride film formed directly on the conformal first silicon nitride film,
   the non-conformal second silicon nitride film having a non-uniform thickness,
   a portion of the non-conformal second silicon nitride film formed over a top surface of the control gate being thicker than another portion of the non-conformal second silicon nitride film formed adjacent the first spacer and the second spacer,
   the non-conformal second silicon nitride film extending over a source region and a drain region of the substrate, and
   the non-conformal second silicon nitride film being deposited over the conformal first silicon nitride film using a plasma enhanced chemical vapor deposition (PECVD) process.

7. The memory device of claim 6, where
the conformal first silicon nitride film and the non-conformal second silicon nitride film are formed over a surface of the control gate, the first spacer, the second spacer, and the substrate.

8. The memory device of claim 6, where a thickness of the conformal first silicon nitride film ranges from about 100 angstroms to about 700 angstroms.

9. The memory device of claim 6, where the conformal first silicon nitride film and the non-conformal second silicon nitride film have a combined thickness of less than 1,000 angstroms.

10. The memory device of claim 6, further comprising a conformal third silicon nitride film, having a substantially uniform thickness, formed on the non-conformal second silicon nitride film.

11. A memory device comprising:
a substrate;
a first dielectric layer formed on a portion of the substrate;
a floating gate formed on the first dielectric layer;
a second dielectric layer formed on the floating gate;
a control gate formed on the second dielectric layer,
   the control gate including a polysilicon material or a germanium material;
a first spacer and a second spacer formed on the substrate and on opposite sides of the control gate;
a first silicon nitride film contacting:
   an upper surface of the polysilicon material or the germanium material included in the control gate,
   the first spacer,
   the second spacer, and
   the substrate,
   the first silicon nitride film having a substantially uniform thickness ranging from about 100 angstroms to about 700 angstroms,
   the first silicon nitride film filling gaps and crevices along the first dielectric layer, the floating gate, the second dielectric layer, the control gate, and interfaces associated with the first spacer and the second spacer,
   the first silicon nitride film filling the gaps and the crevices to improve memory cell data retention of the memory device,
   the first silicon nitride film being deposited using a low pressure chemical vapor deposition (LPCVD) process or using an atomic layer deposition (ALD) process; and a second silicon nitride film formed directly on the first silicon nitride film, the second silicon nitride film having a non-uniform thickness, a portion of the second silicon nitride film formed over the control gate being thicker than other portions of the second silicon nitride film formed adjacent portions of the first silicon nitride film that contact the first spacer and the second spacer, the second silicon nitride film being deposited over the first silicon nitride film using a plasma enhanced chemical vapor deposition (PECVD) process, and the first silicon nitride film and the second silicon nitride film having a combined thickness of less than 1,000 angstroms.

12. The memory device of claim 11, where the first dielectric layer has a thickness ranging from about 70 angstroms to about 110 angstroms, where the floating gate has a thickness ranging from about 400 angstroms to about 1,200 angstroms, where the second dielectric layer has a thickness ranging from about 100 angstroms to about 200 angstroms, and where the control gate has a thickness ranging from about 900 angstroms to about 3,000 angstroms.

13. The memory device of claim 11, where the first spacer and the second spacer include a dielectric material.

14. The memory device of claim 11, further comprising a third silicon nitride film, having a substantially uniform thickness, formed on the second silicon nitride film.

* * * * *